United States Patent
Yang et al.

(10) Patent No.: US 10,531,578 B2
(45) Date of Patent: Jan. 7, 2020

(54) METHOD FOR MANUFACTURING A FLEXIBLE CIRCUIT BOARD INCORPORATING SUNKEN RESISTOR

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Mei Yang, Qinhuangdao (CN); Yan Liu, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 14 days.

(21) Appl. No.: 15/881,873

(22) Filed: Jan. 29, 2018

(65) Prior Publication Data

US 2019/0200464 A1 Jun. 27, 2019

(30) Foreign Application Priority Data

Dec. 25, 2017 (CN) .......................... 2017 1 1421104

(51) Int. Cl.
*H05K 3/46* (2006.01)
*H05K 1/02* (2006.01)
(Continued)

(52) U.S. Cl.
CPC .......... *H05K 3/4644* (2013.01); *H05K 1/028* (2013.01); *H05K 1/032* (2013.01); *H05K 1/167* (2013.01);
(Continued)

(58) Field of Classification Search
CPC .... H05K 1/167; H05K 3/4676; H05K 3/4673; H05K 3/18; H05K 3/22
See application file for complete search history.

(56) References Cited

U.S. PATENT DOCUMENTS 3,154,503 A * 10/1964 Janakirama-Rao ...... H01B 1/02
174/256
3,865,742 A * 2/1975 Greenstein ............... H01C 7/06
252/514

(Continued)

FOREIGN PATENT DOCUMENTS

| CN | 104093280 B | 1/2017 | |
| JP | 03297005 A * | 12/1991 | ............... H01B 1/06 |
| TW | 201715374 A | 5/2017 | |

*Primary Examiner* — Peter Dungba Vo
*Assistant Examiner* — Jeffrey T Carley
(74) *Attorney, Agent, or Firm* — ScienBiziP, P.C.

(57) ABSTRACT

A method for manufacturing a flexible circuit board with resistor which is buried in the board includes steps of providing a composite board, the composite board comprising a substrate, and a physical development core layer formed on the substrate. A silver halide emulsion layer is formed on the physical development core layer and the silver halide emulsion layer is exposed. A developing solution is applied to the halide emulsion layer and washed to form a silver layer on the substrate. A conductive layer is formed on the silver layer and the conductive layer is etched, forming at least one opening. Such opening exposes a portion of the silver layer which contains a buried resistor. Different processes and materials applied in the above procedure serve to increase or decrease the resistance of the resistor as desired.

12 Claims, 5 Drawing Sheets

(51) Int. Cl.
*H05K 1/03* (2006.01)
*H05K 3/22* (2006.01)
*H05K 1/16* (2006.01)
*H05K 3/18* (2006.01)

(52) U.S. Cl.
CPC ............... *H05K 3/18* (2013.01); *H05K 3/22* (2013.01); *H05K 3/4673* (2013.01); *H05K 3/4676* (2013.01); *H05K 2201/0145* (2013.01); *H05K 2201/0154* (2013.01); *H05K 2201/0929* (2013.01); *H05K 2203/0723* (2013.01); *H05K 2203/088* (2013.01)

(56) References Cited

U.S. PATENT DOCUMENTS

| | | | | |
|---|---|---|---|---|
| 3,930,896 | A * | 1/1976 | Takahama | C23C 18/50 428/432 |
| 5,384,230 | A * | 1/1995 | Berg | G03F 7/0952 430/273.1 |
| 6,606,792 | B1 * | 8/2003 | Andresakis | H05K 1/162 29/830 |
| 7,563,564 | B2 * | 7/2009 | Brooks | G03C 5/58 430/401 |
| 2009/0272560 | A1 * | 11/2009 | Tokunaga | H05K 3/106 174/126.1 |
| 2018/0172621 | A1 * | 6/2018 | Cheng | B01D 15/08 |

* cited by examiner

METHOD FOR MANUFACTURING A FLEXIBLE CIRCUIT BOARD INCORPORATING SUNKEN RESISTOR

FIELD

The subject matter herein generally relates to printed circuit boards, and particularly to a flexible circuit board with buried resistor and a method for manufacturing the flexible circuit board.

BACKGROUND

A resistor can be embedded in a board by pattern transfer or soldering on a predetermined location of a printed circuit board. However, a soldered resistor increases thickness of a flexible circuit board, and pattern transfer need several processes of differential etching. A special alkaline etchant is needed for the differential etching and this is unfriendly to environment.

BRIEF DESCRIPTION OF THE DRAWINGS

Implementations of the present technology will now be described, by way of example only, with reference to the attached figures.

DETAILED DESCRIPTION

Figure 1:
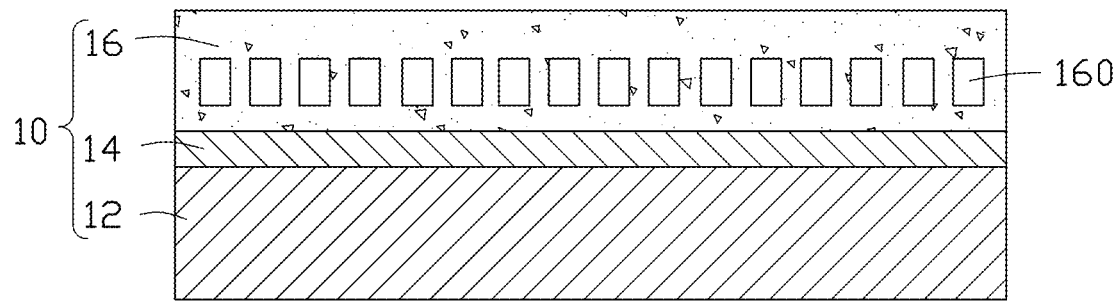
FIG. 1 is a cross-sectional view of a composite board which is provided.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 10:
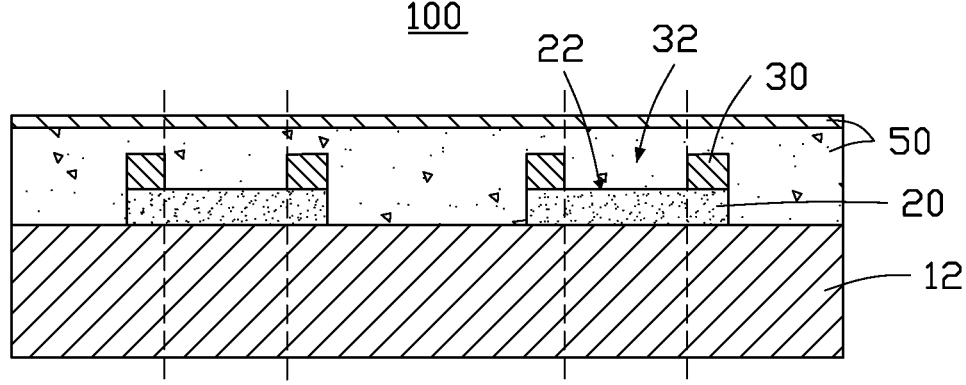
FIG. 10 is a cross-sectional view of a cover layer formed on the conductive layer of FIG. 9.
Figure 11:
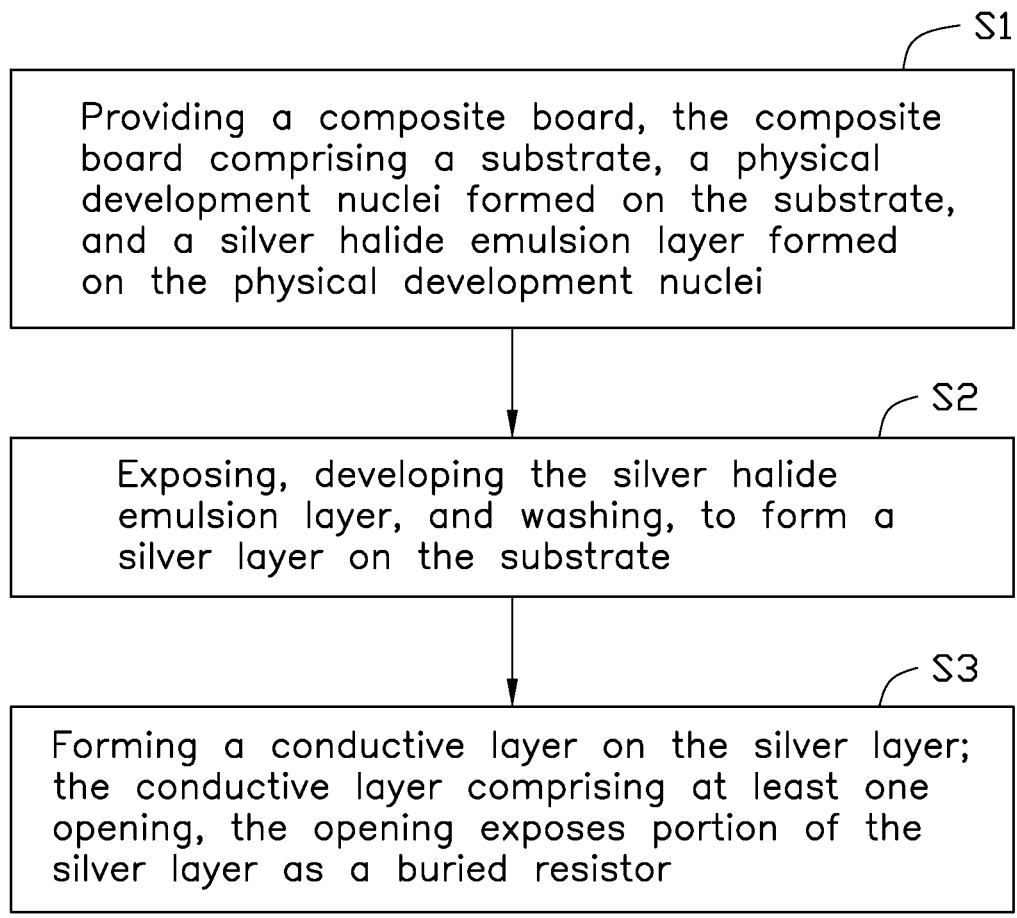
FIG. 11 illustrates a flowchart of method of manufacturing the flexible circuit board in accordance with one embodiment.

FIG. 11 illustrates a flowchart in accordance with a second embodiment. The example method 200 for manufacturing the flexible circuit board 100 (shown in FIG. 10) is provided by way of an example, as there are a variety of ways to carry out the method. Additionally, the illustrated order of blocks is by example only, and the order of the blocks can change. Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps. The method 200 can begin at block S1.

At block S1, as shown in FIG. 1, a composite board 10 is provided. The composite board 10 includes a supporting substrate 12, a physical development core layer 14 formed on the supporting substrate 12, and a silver halide emulsion layer 16 formed on the physical development core layer 14.

The supporting substrate 12 is made from polyimide, thermal plastic polyimide, polyethylene terephthalate or polythylene naphthalate. The physical development core layer 14 and the silver halide emulsion layer 16 are formed on the supporting substrate 10 via coating.

The physical development core layer 14 is physical developing core layer of nano-metallic sulfides and includes a plurality of physical developing cores. The nano-metallic sulfides physical development core layer 14 comprises silver sulfide and alcohol solution.

The silver halide emulsion layer 16 includes a plurality of silver halide grains 160. The silver halide emulsion layer 16 is mainly composed of gelatin, water-soluble polymer, silver halide grains, and water.

Using one liter of silver halide emulsion as a reference, the mass of gelatin and the water-soluble polymer is in a range from about 22 g to about 60 g, and silver halide grains are in a range from about 20 g to about 80 g. The remainder is water, and a weight of water-soluble polymer is 5-25% of weight of gelatin.

The average size of the silver halide particles is between 0.25 um and 0.5 um. The silver halide grains are silver chloride, or silver iodide or a mixture of thereof. The water-soluble polymer is polyvinylpyrrolidone, polyethylene glycol, or a mixture of thereof.

At block S2, the silver halide emulsion layer 16 is exposed, developed, and washed to form a silver layer 20 on the supporting substrate 12.

Figure 2:
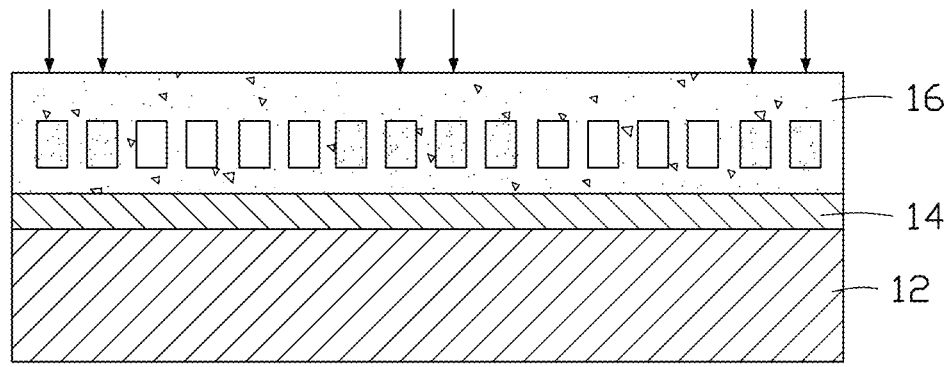
FIGS. 2~4 are cross-sectional views of different stages of exposure during the exposing processes of the composite board in FIG. 1.

At block S21, as shown in FIG. 2, the silver halide emulsion layer 16 is exposed to laser beam.

Figure 3:
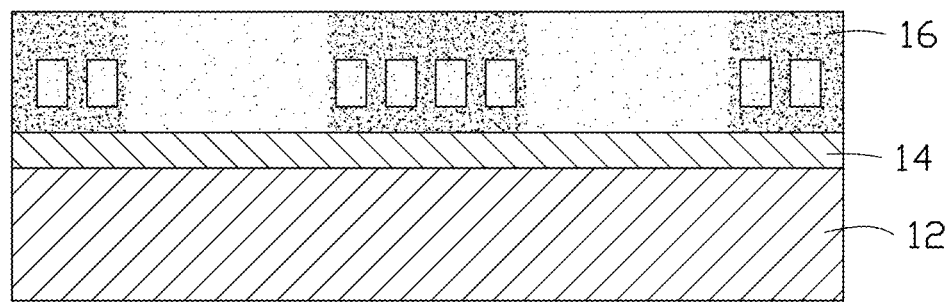
Figure 4:
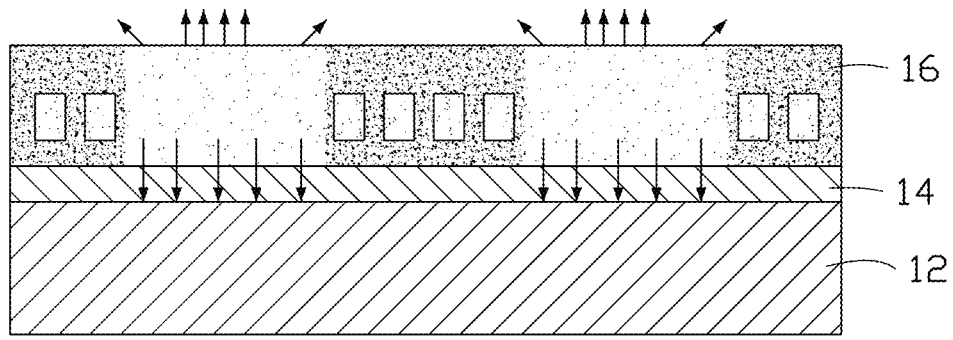
Figure 5:
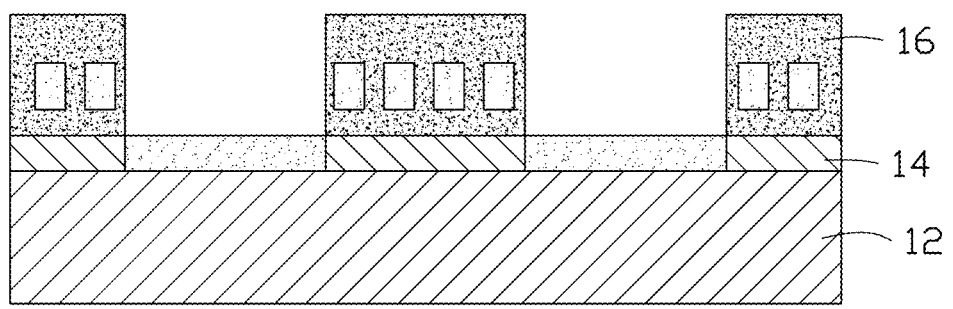
FIG. 5 is a cross-sectional view of the composite board in FIG. 4 developed.
Figure 6:
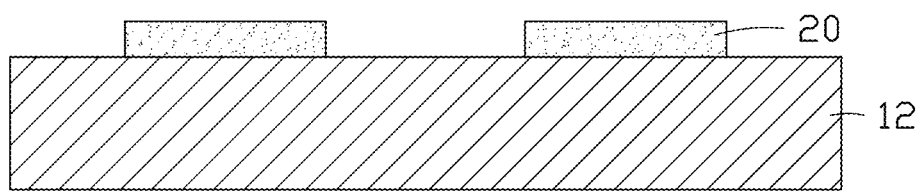
FIG. 6 is a cross-sectional view of the composite board in FIG. 5 washed to form a silver layer on the substrate.

At block S22, as shown in FIGS. 3-5, the silver halide emulsion layer 16 is developed under a developing solution. The developing solution is composed of an alkaline solution combination for developing and fixing. In the illustrated embodiment, the developing solution is composed of protective agent, accelerant, silver complexing agent, developer, inhibitor, and thickening agent.

The protective agent has a mass percentage of about 60% of a total mass of the developing solution.

The accelerant has a mass percentage of about 15% of a total mass of the developing solution.

The silver complexing agent has a mass percentage of about 7% of a total mass of the developing solution.

The protective agent has a mass percentage of about 15% of a total mass of the developing solution.

The inhibitor has a mass percentage of about 1% of a total mass of the developing solution.

The thickening agent has a mass percentage of about 2% of a total mass of the developing solution.

The protective agent can be one of anhydrous sodium sulfite, anhydrous potassium sulfite, coke potassium sulfite, and sodium pyrosulphite.

The accelerant is selected from a group consisting of sodium hydroxide, potassium hydroxide, sodium carbonate, potassium carbonate, and any combination thereof. The silver complexing agent is selected from a group consisting of sodium thiosulfate, organic ammonium, pyridine, pyrimidine, and any combination thereof. The developer is selected from a group consisting of hydroquinone, metol, phenidone, 4-methyl phenidone, and any combination thereof. The inhibitor is selected from a group consisting of potassium bromide, benzo triazole three six nitrobenzo imidazole, and any combination thereof. The thickening agent is sodium carboxymethyl cellulose or hydroxyethyl cellulose sodium salt.

The development process is carried out in three stages. In the first stage, as shown in FIG. 3, silver halide in the unexposed silver halide form a silver complex with the developing solution, and the silver complex dissolves the silver halide emulsion layer 16.

In the second stage, as shown in FIG. 4, the silver complex is diffused into the developing solution and the physical development core layer 14. The arrow represents a diffusion direction of the silver complex.

In the third stage, as shown in FIG. 5, the physical development cores catalytic the silver complex in the physical development core layer 14 and occurs a redox reaction, and an oxidation reduction reaction takes place, to generate metallic silver particles deposit on the supporting substrate 12, and a silver layer is formed on the supporting substrate 12.

As shown in FIG. 5, the physical development core layer 14 is washed off from the supporting substrate 12 to retain the silver layer 20 on the supporting substrate 12, and a silver layer 20 is formed on the supporting substrate 12.

The silver layer 20 formed by this method has a resistance in a range from 0.1 to 1000 ohms. Wherein R is resistance of the silver layer 20; $\rho$ is resistance coefficient; L is length; W is width; H is thickness; $R_s$ is square resistance; A is cross sectional area, and A=H*W. Calculation $R=\rho*L/A=(\rho/H)*(L/W)=R_s*L/W$, can be applied. That is, the resistance of the silver layer 20 can be adjusted by changing the length and width of the silver layer 20. When using above method to form the silver layer 20, the resistance of the silver layer 20 is adjustable.

As can be seen, the silver complexing agent in the development solution is different, and the stacking of the silver layer is thus different. The greater the number of the silver particles, the closer the stacking, and the stronger is the conductivity of the silver layer. Conversely, the closer stacking results in a smaller resistance. That is the resistance of the silver layer can be changed by selecting different silver complexing agents and additives.

Therefore, the condition of silver layer, such as shape, size, and stacked condition of silver particles, can be controlled by adjusting the exposure intensity, the kinds of complexing agents in the developing layer, and by the development temperature.

Figure 7:
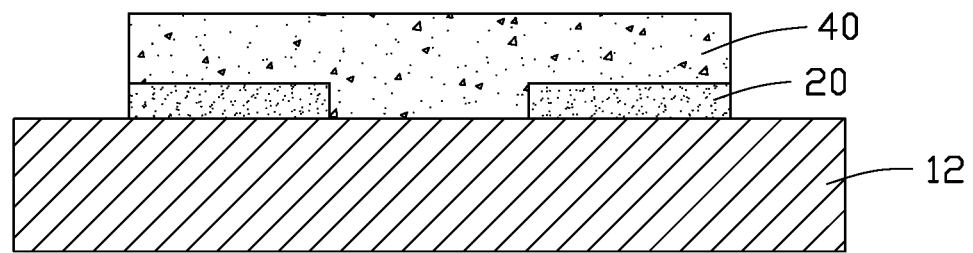
FIG. 7 is a cross-sectional view of photosensitive film formed on the silver layer of FIG. 6.
Figure 8:
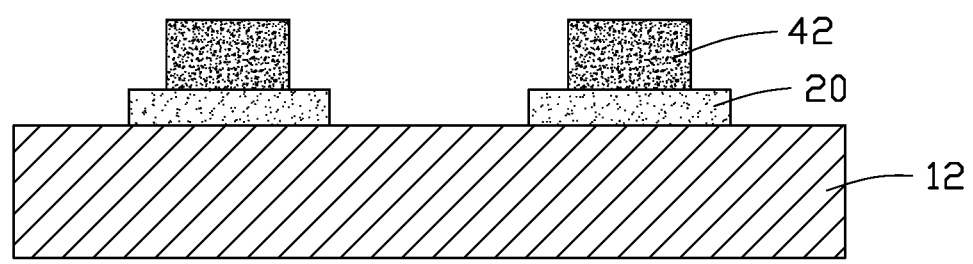
FIG. 8 is a cross-sectional view of a protective layer formed on portion of the silver layer of FIG. 7.
Figure 9:
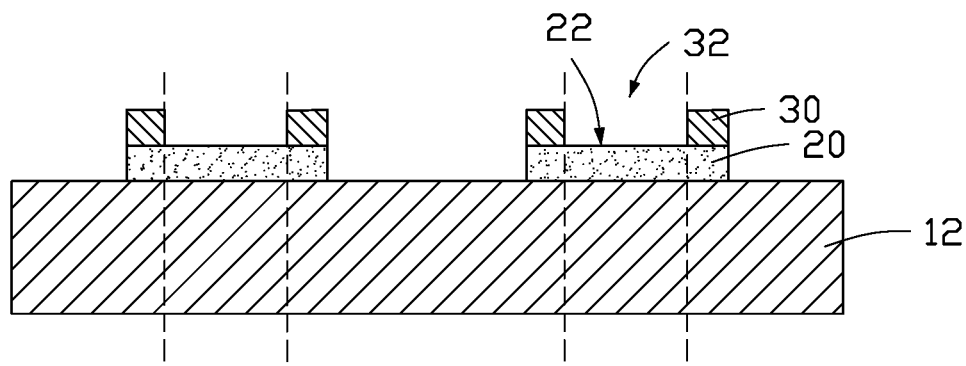
FIG. 9 is a cross-sectional view of a copper layer formed on the silver layer to form a conductive layer.

FIGS. 7-9 show a conductive layer 30 formed on portion of surface of the silver layer 20. The method of forming a conductive layer 30 includes steps as follows:

As shown in FIG. 7, a photosensitive film 40 is formed on the silver layer 20.

As shown in FIG. 8, the photosensitive film 40 is exposed and developed to form a protection layer 42 on a portion of the silver layer 20.

As shown in FIG. 9, a copper layer is formed on the silver layer 20 which is not covered by the protective layer 42. The copper layer is formed by electroplating method or a chemical vapor deposition. Then, the protective layer 42 is removed from the silver layer 20, and the removed protective layer 42 creates an opening of the conductive layer 30. The opening 32 exposes portions of the silver layer 20 in which resistors 22 are buried.

At block S4, as shown in FIG. 1, a cover layer 50 is formed on the conductive layer 30, and the cover layer 50 also covers buried resistors 22.

In other embodiments, the silver layer 20 and the conductive layer 30 can be formed on opposite surfaces of the supporting substrate 12, that is to say, these steps can be used to make double sided boards and multilayer boards.

FIG. 10 illustrates a flexible circuit board 100 with sunken or buried resistor according to one embodiment. The flexible circuit board 100 with buried resistor includes a substrate 12, a silver layer 20 formed on the supporting substrate 12, a conductive layer 30 formed on the silver layer 20, and a covering layer formed on the conductive layer 30.

The conductive layer 30 includes at least one opening 32, the opening 32 exposing a part of the silver layer 20 which contains buried resistor 22. The cover layer 50 also covers the buried resistor 22. The supporting substrate 12 is made from polyimide, thermal plastic polyimide, polyethylene terephthalate, or polyethylene naphthalate.

The embodiments shown and described above are only examples. Therefore, many such details in the art are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will, therefore, be appreciated that the embodiments described above may be modified within the scope of the claims.

What is claimed is:

1. A method for manufacturing a flexible circuit board with a buried resistor comprising:
   providing a composite board, the composite board comprising a supporting substrate, a physical development core layer formed on the supporting substrate, and a silver halide emulsion layer formed on the physical development core layer;

exposing a portion of the silver halide emulsion layer to laser energy; wherein another portion of the silver halide emulsion layer is unexposed;

the unexposed silver halide emulsion layer being developed in a developing solution, wherein silver halide in the unexposed silver halide emulsion layer is able to form a silver complex with the developing solution and dissolve the silver halide emulsion layer, and the silver complex diffuses into the physical development core layer, the silver complex is catalyzed by the physical development core layer in the physical development core layer and causes a redox reaction, and silver particles deposit on the supporting substrate to form a silver layer;

washing the physical development core layer off of the supporting substrate to retain only the silver layer on the supporting substrate;

forming a conductive layer on the silver layer; and etching the conductive layer to form at least one opening, wherein the opening exposes a portion of the silver layer to form a buried resistor.

2. The method of claim 1, wherein after the step of forming a conductive layer on the silver layer, performing a step of forming a cover layer on the conductive layer, and the cover layer covers the buried resistor.

3. The method of claim 2, wherein the step of forming the conductive layer on the silver layer comprises:

forming a photosensitive film on the silver layer;

exposing and developing the photosensitive film to form a protective layer on a portion of the silver layer;

forming a copper layer on the silver layer to form a conductive layer; and removing the protective layer, and the conductive layer which was formed on the silver layer.

4. The method of claim 3, wherein the conductive layer is formed using an electroplating method or a chemical vapor deposition method.

5. The method of claim 1, wherein the supporting substrate is made from polyimide, thermal plastic polyimide, polyethylene terephthalate or polythylene naphthalate.

6. The method of claim 1, wherein the developing solution is composed of protective agent, accelerant, silver complexing agent, developer, inhibitor and thickening agent, and the protective agent has a mass percentage of 60% of a total mass of the developing solution, the accelerant has a mass percentage of 15% of a total mass of the developing solution, the silver complexing agent has a mass percentage of 7% of a total mass of the developing solution, the protective agent has a mass percentage of 15% of a total mass of the developing solution, the inhibitor has a mass percentage of 1% of a total mass of the developing solution, the thickening agent has a mass percentage of 2% of a total mass of the developing solution.

7. The method of claim 6, wherein the protective agent is selected from anhydrous sodium sulfite, anhydrous potassium sulfite, coke potassium sulfite or sodium pyrosulphite.

8. The method of claim 6, wherein the accelerant is selected from a group consisting of sodium hydroxide, potassium hydroxide, sodium carbonate, and potassium carbonate.

9. The method of claim 6, wherein the silver complexing agent is selected from a group consisting of sodium thiosulfate, organic ammonium, pyridine, and pyrimidine.

10. The method of claim 6, wherein the developer is selected from a group consisting of hydroquinone, metol, phenidone, and 4-methyl phenidone.

11. The method of claim 6, wherein the inhibitor is selected from a group consisting of potassium bromide, and benzo triazole three six nitrobenzo imidazole.

12. The method of claim 6, wherein the thickening agent is sodium carboxymethyl cellulose or hydroxyethyl cellulose sodium salt.

* * * * *